US012704526B2

(12) United States Patent
Shin et al.

(10) Patent No.: US 12,704,526 B2
(45) Date of Patent: Aug. 11, 2026

(54) PREFABRICATED RUBBER SOCKET

(71) Applicants: Jong Cheon Shin, Gyeonggi-do (KR); Dong Ho Ha, Gyeonggi-do (KR)

(72) Inventors: Jong Cheon Shin, Gyeonggi-do (KR); Dong Ho Ha, Gyeonggi-do (KR)

( * ) Notice: Subject to any disclaimer, the term of this patent is extended or adjusted under 35 U.S.C. 154(b) by 133 days.

(21) Appl. No.: 18/585,937

(22) Filed: Feb. 23, 2024

(65) Prior Publication Data

US 2025/0216414 A1 Jul. 3, 2025

(30) Foreign Application Priority Data

Jan. 2, 2024 (KR) ........................ 10-2024-0000400

(51) Int. Cl.
*G01R 1/04* (2006.01)
*G01R 1/073* (2006.01)
*H01R 33/76* (2006.01)

(52) U.S. Cl.
CPC ....... *G01R 1/0466* (2013.01); *G01R 1/07314* (2013.01); *H01R 33/7664* (2013.01); *H01R 2201/20* (2013.01)

(58) Field of Classification Search
None
See application file for complete search history.

(56) References Cited

U.S. PATENT DOCUMENTS 5,012,187 A * 4/1991 Littlebury ............ G01R 1/0735 324/755.09
7,384,279 B2 * 6/2008 Igarashi ............. G01R 1/07378 439/91
7,537,459 B2 * 5/2009 Takegahara .............. H01R 4/04 439/66
7,726,976 B2 * 6/2010 Mason ................. H05K 7/1061 439/91
7,726,984 B2 * 6/2010 Bumb, Jr. .......... H01R 13/2414 439/91
7,821,283 B2 * 10/2010 Yamada ............. G01R 1/07378 439/91
9,696,344 B2 * 7/2017 Lee ...................... G01R 1/0416
2021/0293880 A1 * 9/2021 Oh ....................... G01R 1/0483

FOREIGN PATENT DOCUMENTS

KR 10-0588029 6/2006

* cited by examiner

*Primary Examiner* — Richard Isla

(57) ABSTRACT

The present disclosure relates to a rubber socket formed by assembling a plurality of individually manufactured electrically-conductive blocks, the blocks having a plurality of elastic electrically-conductive parts and an insulating part, respectively, are individually manufactured, a lower protruding portion, having a thickness smaller than that of the support member, of each electrically-conductive part is inserted into the through hole of the support member, the electrically-conductive block is coupled to the support member by adhering a lower surface of the insulating part to an upper surface of the support member to enable a large-area rubber socket to be manufactured.

9 Claims, 9 Drawing Sheets

PREFABRICATED RUBBER SOCKET

CROSS-REFERENCE TO RELATED APPLICATION

This application claims priority of Korean Patent Application No. 10-2024-0000400, filed on Jan. 2, 2024, in the KIPO (Korean Intellectual Property Office), the disclosure of which is incorporated herein entirely by reference.

BACKGROUND OF THE INVENTION

Field of the Invention

The present disclosure relates to a rubber socket, and more particularly, to a prefabricated rubber socket which capable of transmitting an electrical signal between a device under test and a tester.

Description of the Related Art

After a semiconductor device manufacturing process is completed, a test process for a semiconductor device is required. When a test for the semiconductor device is being tested, a test socket configured to connect a tester which is a test equipment and a semiconductor device which is a device under test is required. In the test process, the test socket is an intermediate component through which a signal generated from the tester can be transmitted to the semiconductor device.

A typical test socket is a pogo socket and a rubber socket. The pogo socket has a configuration in which a pogo pin elastically supported by a spring is assembled in a housing. On the contrary, the rubber socket has a configuration in which a plurality of electrically-conductive parts, each of which consisting of an elastic material such as silicon and a plurality of electrically-conductive particles contained in the elastic material, are arranged in an insulating part, which is made of an elastic material such as silicon, to be insulated from each other. Therefore, the above rubber socket can absorb mechanical shock or deformation without using mechanical means such as soldering or springs, and thus has the characteristic of enabling a smooth connection with the device or the like.

Recently, the semiconductor devices using a frequency for 5G or higher frequencies (usually 2 Ghz or higher) have been being increased. In a process for testing such high-frequency semiconductor device, it is difficult to reduce a length of the pogo pin of the pogo socket due to constraints in a manufacturing process for the pogo pin, so a length of the electrically-conductive path is long, and the pogo pin and a spring that elastically supports the pogo pin act as an inductance. As a result, it is difficult to use the pogo socket in a test process requiring a communication speed of 1 Ghz or higher.

To overcome a limitation of such pogo socket, the rubber socket having an anisotropic electro-conductivity has been used. The rubber socket has a structure suitable for high-speed signal transmission because a length of electrically-conductive path thereof is short.

FIG. 1 is a view illustrating a conventional test apparatus employed for testing a semiconductor device using a rubber socket.

The rubber socket 30 is composed of a plurality of electrically-conductive parts 31 formed at positions corresponding to terminals 11 of a device 10 under test, respectively (wherein each of electrically-conductive parts is formed of an elastic insulating material and a plurality of electrically-conductive particles 32 arranged in the elastic insulating material in a thickness direction), and an insulating part 33 arranged around the electrically-conductive parts to insulate and support the electrically-conductive parts. An edge of the rubber socket 30 is fixed by a frame 35.

This rubber socket 30 is mounted on and aligned with a tester 20 by the frame 35 and alignment pins 25, and as shown in FIG. 2, when the terminals 11 of the device 10 under test pressurize the electrically-conductive parts 31 of the rubber socket 30, the electrically-conductive particles 32 in each electrically-conductive part bring into contact with each other to allow the electrically-conductive parts 31 to be electrically connected to each other. Accordingly, a test signal generated in the tester is transmitted from pads 21 of the tester to the terminals 11 of the device under test through the electrically-conductive parts 31 of the rubber socket to perform the test for the device under test.

FIGS. 3 and 4 are views showing a method for manufacturing a conventional rubber socket. As shown in the drawing, upper and lower magnetism moulds 40 and 50, each of which having a ferromagnetic body 41, 51 formed on portions where the electrically-conductive parts are to be formed and non-magnetic bodies 42, 52 formed on other portions); and an electrically-conductive particle mixture in which the plurality of electrically-conductive particles 32 are dispersed in a liquefied elastic insulating material 33A are prepared. Next, the frame 35 is placed between the upper and lower magnetism moulds via a spacer 38, and a space between the upper and lower magnetism moulds is then filled with the electrically-conductive particle mixture. In this state, when a magnetic field is applied to the electrically-conductive particle mixture in a thickness direction (i.e., a vertical direction in the drawing), the electrically-conductive particles dispersed in the liquefied elastic insulating material are oriented such that they are concentrated to positions at which the ferromagnetic bodies 41 and 51 and simultaneously lined up in the thickness direction.

Then, the electrically-conductive particle mixture is cured, and the upper and lower magnetism moulds and the spacers are removed, so the rubber socket 30, in which the electrically-conductive parts 31 formed by the elastic insulating material and the plurality of electrically-conductive particles arranged therein and the insulating part 33 formed of the elastic insulating material are fixed to the frame 35, is completed.

In such rubber socket using the magnetic field, due to foreign substances or bubbles generated inside a liquefied silicon during a manufacturing process, the magnetic field is not uniformly applied to the positions at which the electrically-conductive parts are formed, and for this reason, the electrically-conductive particles are connected to each other between the adjacent electrically-conductive parts to cause a dielectric breakdown, some defective electrically-conductive parts having poor electrical characteristics may thus be generated. These defects are further increased as a pitch between the electrically-conductive parts becomes narrow and the number of electrically-conductive parts is increased.

In a large-sized semiconductor devices such as an application processor (AP), a central processing unit (CPU) which has been developed in recent, the number of electrodes has been increased to 1,000~220,000. In order to test such a semiconductor device, the area of the rubber socket must be increased and 1,000~220,000 electrically-conductive parts of the rubber socket must also be formed. As the number of electrically-conductive parts in the rubber socket is increased, the number of defective electrically-conductive parts may be increased proportionally during a manufacturing process. Since a conventional rubber socket is manufactured as one piece, there is a problem in that even if a defect is generated in any one electrically-conductive part, the rubber socket cannot be used, and the entire rubber socket should thus be replaced with new one. In particular, in a large-area rubber socket, such defects result in a significant increase in manufacturing cost.

In addition, since when the electrically-conductive parts having a large area and a narrow pitch are manufactured, it is difficult to form the electrically-conductive parts uniformly due to interference from the magnetic field, there is a problem in that shape and thickness of the electrically-conductive parts on a central portion of the rubber socket differ from those of the electrically-conductive parts on a peripheral portion, allowing the signal characteristics of the rubber socket not to constant.

Furthermore, in order to manufacture the rubber socket having the electrically-conductive parts with a large area and a narrow pitch, the magnetism mould having the ferromagnetic bodies with a size and pitch corresponding to those of the electrically-conductive parts is required. However, a large-sized magnetism mould with a narrow spacing between the ferromagnetic bodies has a problem in that it is difficult to manufacture itself and a mould manufacturing cost is high.

SUMMARY OF THE INVENTION

The present disclosure is conceived in consideration of the above-described problems, and an object of the present disclosure to provide a rubber socket formed by assembling a plurality of individually manufactured electrically-conductive blocks to a support member.

In order to achieve the above-mentioned object, a rubber socket according to the present disclosure is a rubber socket disposed between a device under test and a tester to electrically connect terminals of the device under test and pads of the tester to each other, this rubber socket includes a plate-shaped support member including a central region portion having through holes formed therein and at positions corresponding to the terminals of the device under test, respectively and having a plurality of divided zones, and a peripheral region portion located outside the central region portion; and a plurality of electrically-conductive blocks disposed on the plurality of divided zones of the support member, respectively, each electrically-conductive block being provided with electrically-conductive parts formed by arranging a plurality of electrically-conductive particles in an elastic insulating material in a thickness direction and an insulating part disposed around the electrically-conductive parts to insulate and support the electrically-conductive parts; wherein the electrically-conductive parts are formed at positions corresponding to the through holes of the divided zones, respectively, each electrically-conductive part has a lower protruding portion protruding below the insulating part, having a thickness greater than that of the support member and inserted into the through hole, and a lower surface of the insulating part is adhered to an upper surface of the support member by an adhesive applied the upper surface of the support member, so the electrically-conductive block is coupled to the support member.

The plurality of divided zones may have the same size.

A piece of the electrically-conductive block, which includes the damaged electrically-conductive part may be replaced with a new piece of the electrically-conductive block, which includes a normal electrically-conductive part, for repair.

The electrically-conductive part may have an upper protruding portion protruding above the insulating part.

A support film may be attached to an upper surface of the insulating part.

The adhesive may be silicon adhesive.

The support member may be made of engineering plastic.

The support member may have a plurality of position alignment holes formed in the peripheral region portion thereof for aligning a position thereof.

The prefabricated rubber socket may further include a frame to which the peripheral region portion of the support member is attached, and the frame includes a plurality of position alignment holes formed therein for aligning a position thereof.

In the prefabricated rubber socket according to the present disclosure, the electrically-conductive block is checked in advance whether it has defects, the damaged electrically-conductive block is replaced with a non-defective electrically-conductive block, and the non-defective electrically-conductive block is assembled to the support member, so the faulty rubber socket nearly does not occur.

In addition, in the prefabricated rubber socket according to the present disclosure, instead of replacing the entire electrically-conductive block including the damaged electrically-conductive part, only a piece of the electrically-conductive block, which includes the damaged electrically-conductive part, can be replaced with new piece of the electrically-conductive block, which includes a normal electrically-conductive part, for repair, so this electrically-conductive block may be reused and it is possible to significantly reduce manufacturing cost for the rubber socket.

Furthermore, in the prefabricated rubber socket according to the present disclosure, since the small-sized electrically-conductive blocks, each of which including the electrically-conductive parts with uniform electrical characteristics, can be separately manufactured and assembled, cost for manufacturing the magnetism mould is reduced, and stable test can be performed by transmitting uniform electrical signals to a large-sized semiconductor device.

Also, in the prefabricated rubber socket according to the present disclosure, the electrically-conductive blocks are independently separated from each other and can be thus operated individually without being influenced by other electrically-conductive blocks, so it is possible to prevent deformation of the electrically-conductive block caused by a transfer of necessary deformation of the adjacent the electrically-conductive block.

In addition, in the prefabricated rubber socket according to the present disclosure, since the position alignment holes are provided in the support member for aligning the position of the support member with respect to the tester or the device under test, a process for attaching the separate frame is not required, thereby improving manufacturing efficiency.

BRIEF DESCRIPTION OF THE DRAWINGS

The above and other features and advantages will become more apparent to those of ordinary skill in the art by describing in detail exemplary embodiments with reference to the attached drawings, in which.

In the following description, the same or similar elements are labeled with the same or similar reference numbers.

DETAILED DESCRIPTION

Figure 1:
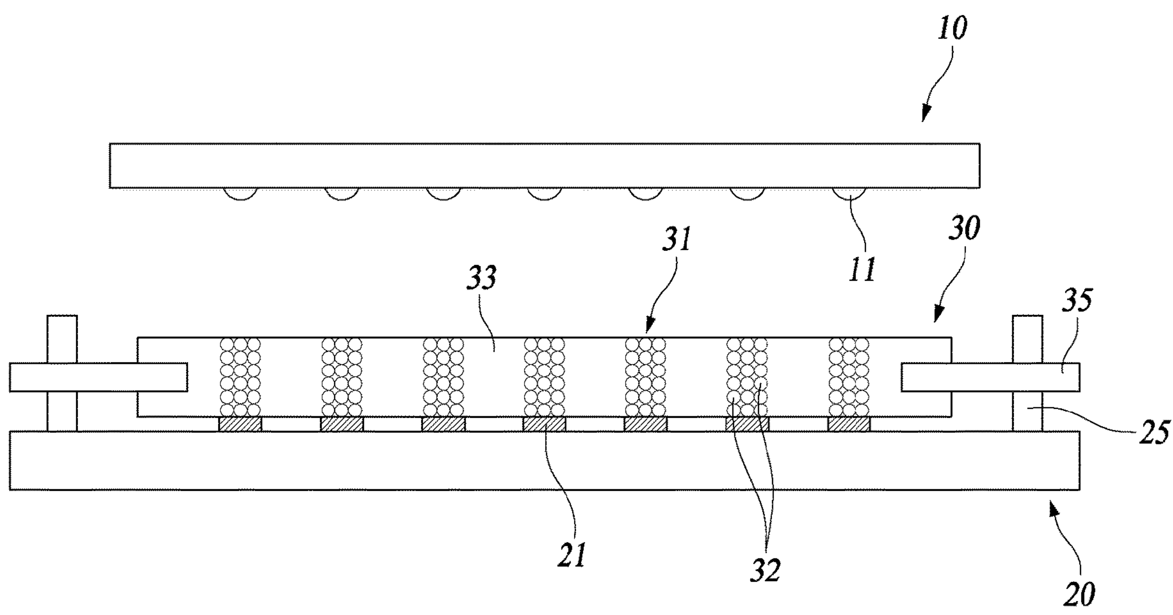
FIG. 1 is a view showing a test apparatus using a conventional rubber socket.
Figure 2:
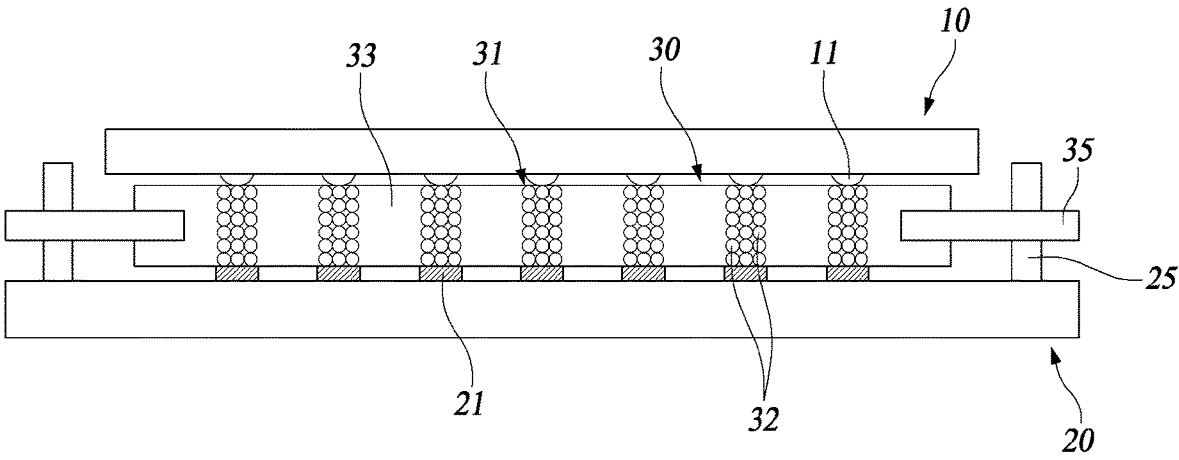
FIG. 2 is a view showing a test process using the conventional rubber socket.
Figure 3:
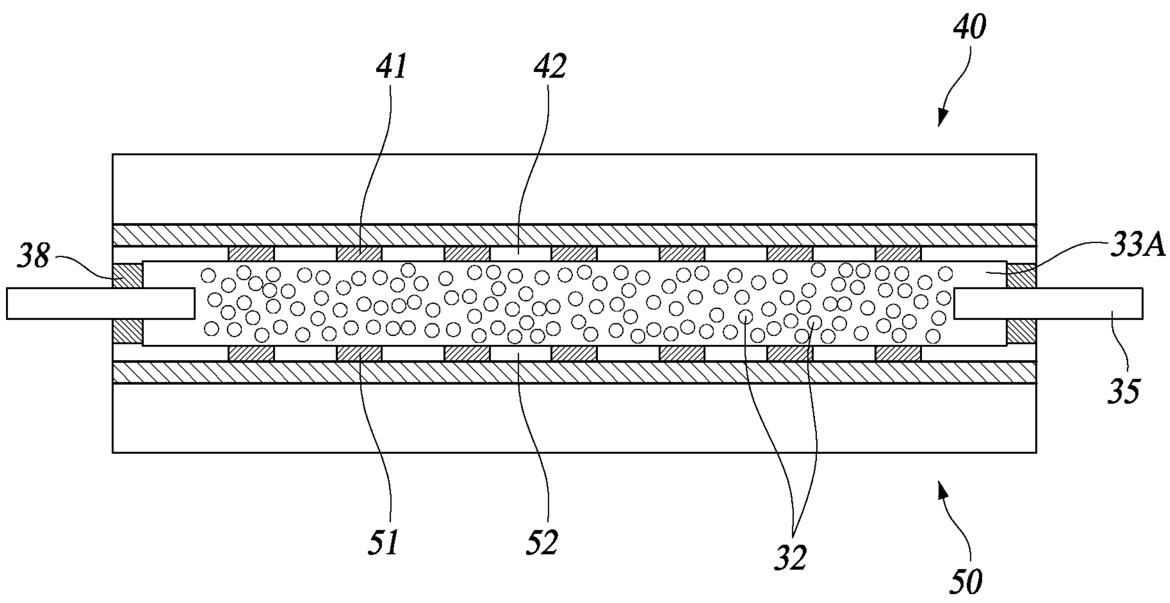
FIGS. 3 and 4 are views schematically showing a process of manufacturing the conventional rubber socket.
Figure 4:
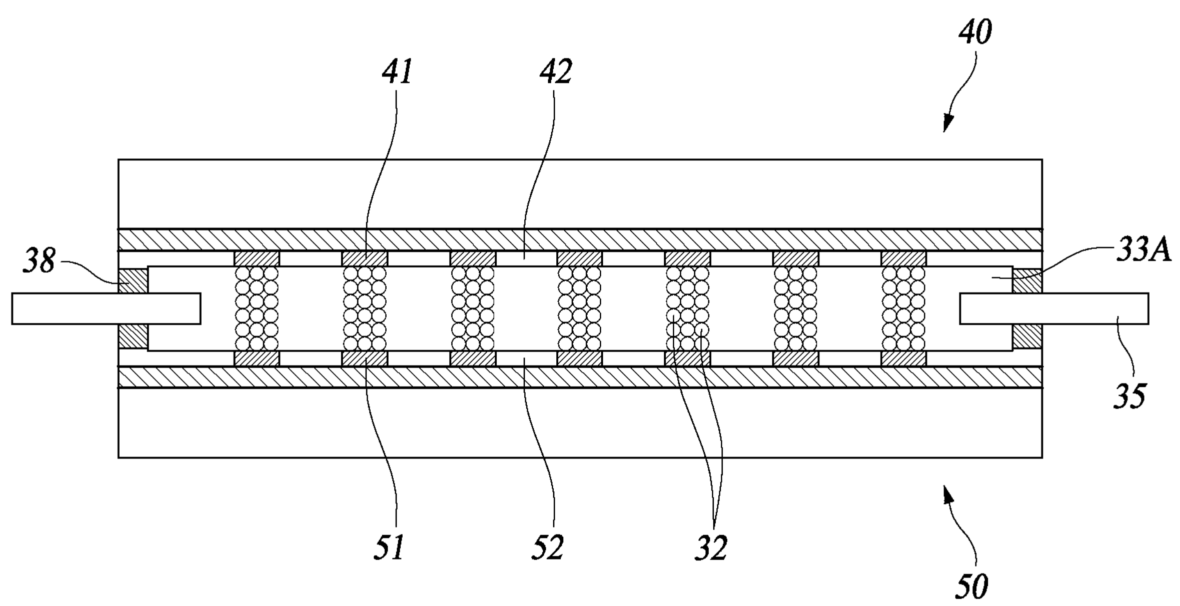

Hereinafter, a test apparatus according to preferred embodiments of the present disclosure will be elucidated in detail with reference to the accompanying drawings.

Since the present disclosure may have various modifications and may have various embodiments, specific embodiments are illustrated in the drawings and described in detail in the detailed description.

However, the detail description is not intended to limit the present disclosure to a specific embodiment, it should be understood that the detail description includes all modifications, equivalents and substitutes included in the spirit and scope of the present disclosure.

In addition, the term "connect" in the detail description means the state in which A component is directly connected to B component as well as the state in which C component is disposed between A component and B component so that A component is indirectly connected to B component via C component. On the other hand, when it is mentioned in the detail description that A component is "directly connected" to B component, it should be understood that no other component is disposed between the components A and B.

As used in the detailed description and the appended claims, the singular forms are used only for explaining a specific embodiment, and are not intended to limit the present disclosure. The singular forms include the plural forms as well, unless the context clearly indicates otherwise.

In addition, the terms "comprise" and/or "comprising" or "have" and/or "having" used herein specify the presence of stated features, regions, integers, steps, operations, elements, and/or components, but do not preclude the presence or addition of one or more other features, regions, integers, steps, operations, elements, components, and/or groups thereof.

Although the terms of "first", "second", etc. are used herein to describe various components, it is obvious that these components should not be limited by the above terms. These terms are employed only for distinguishing one component from another component.

In addition, components of an embodiment described with reference to each drawing are not limitedly applied only to that embodiment, and may be implemented to be included in other embodiment within the scope in which the technical spirit of the present disclosure is maintained. Furthermore, even though a separate description is omitted, it is obvious that a plurality of embodiments may be implemented again as one integrated embodiment.

In addition, in the description with reference to the accompanying drawings, regardless of the reference numerals, the same or related reference numerals are given to the same components, and the overlapping description thereof will be omitted. In describing the present disclosure, if it is determined that a detailed description of a related known technology may unnecessarily obscure the gist of the present disclosure, a detailed description thereof will be omitted.

Figure 5:
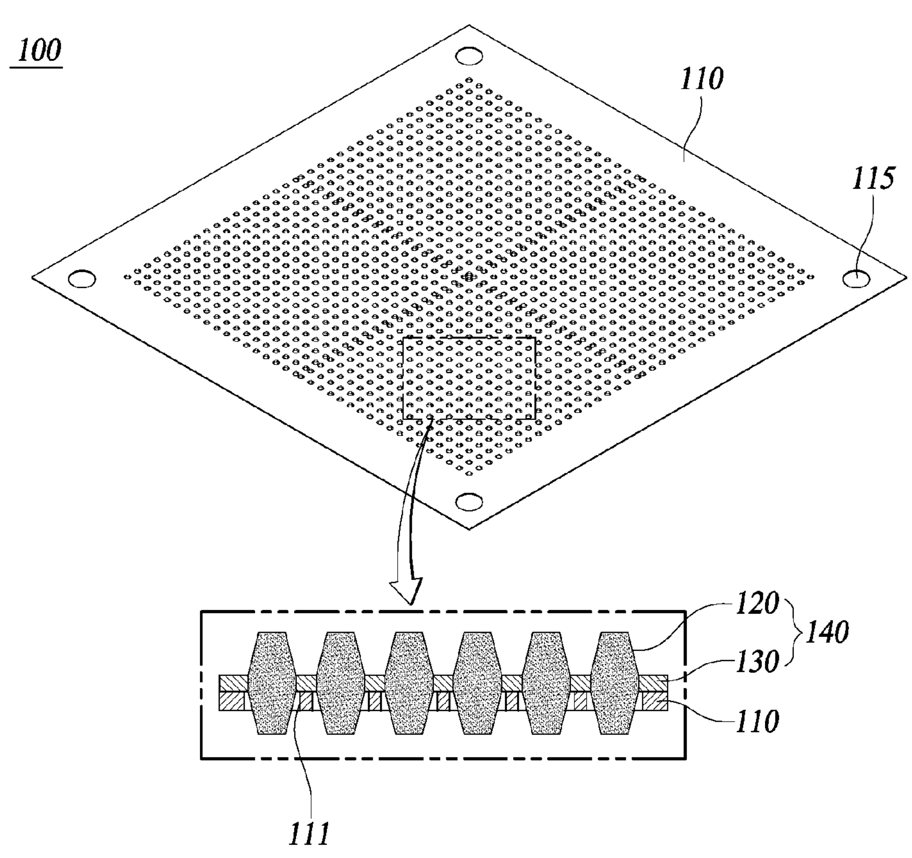
FIG. 5 is a view showing a rubber socket according to one embodiment of the present disclosure.
Figure 6:
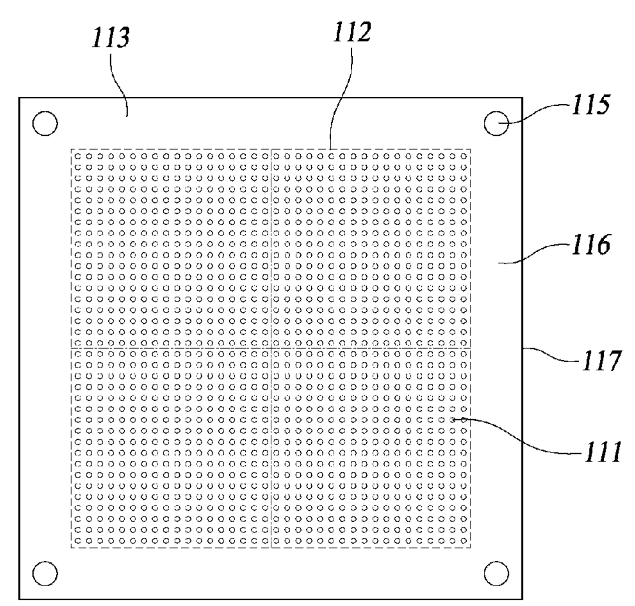
FIG. 6 is a view showing a support member of the rubber socket according to one embodiment of the present disclosure.
Figure 7:
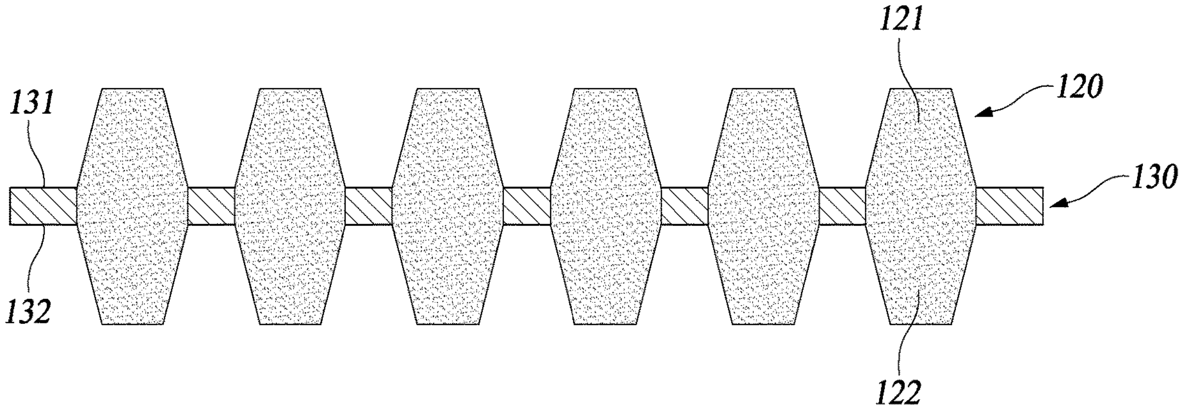
FIG. 7 is a view showing an electrically-conductive block of the rubber socket according to one embodiment of the present disclosure.
Figure 8:
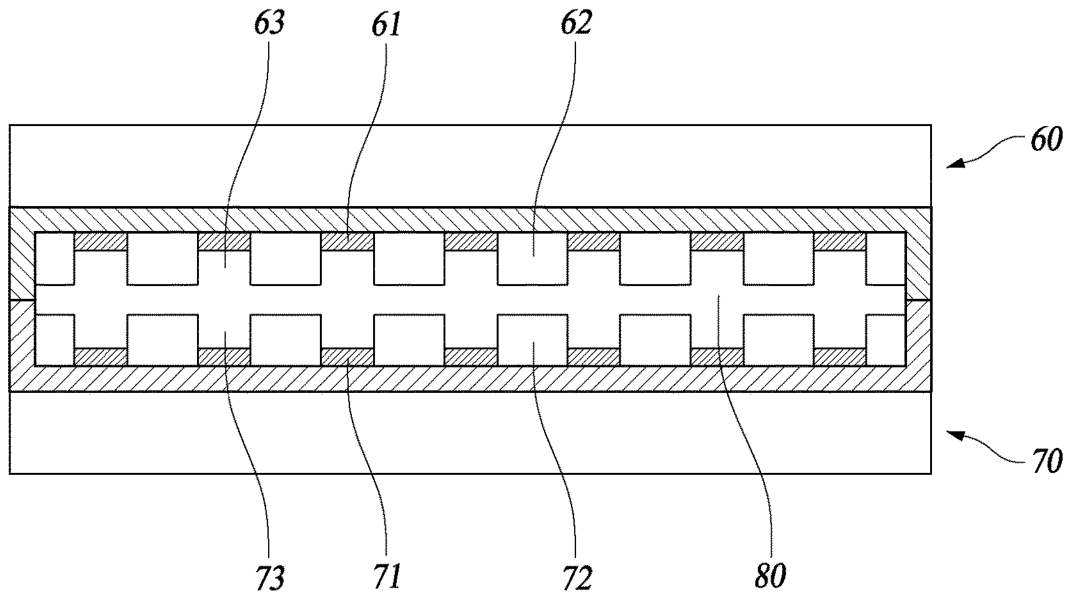
FIGS. 8 to 10 are views schematically showing the process of manufacturing the electrically-conductive block of the rubber socket according to one embodiment of the present disclosure.
Figure 9:
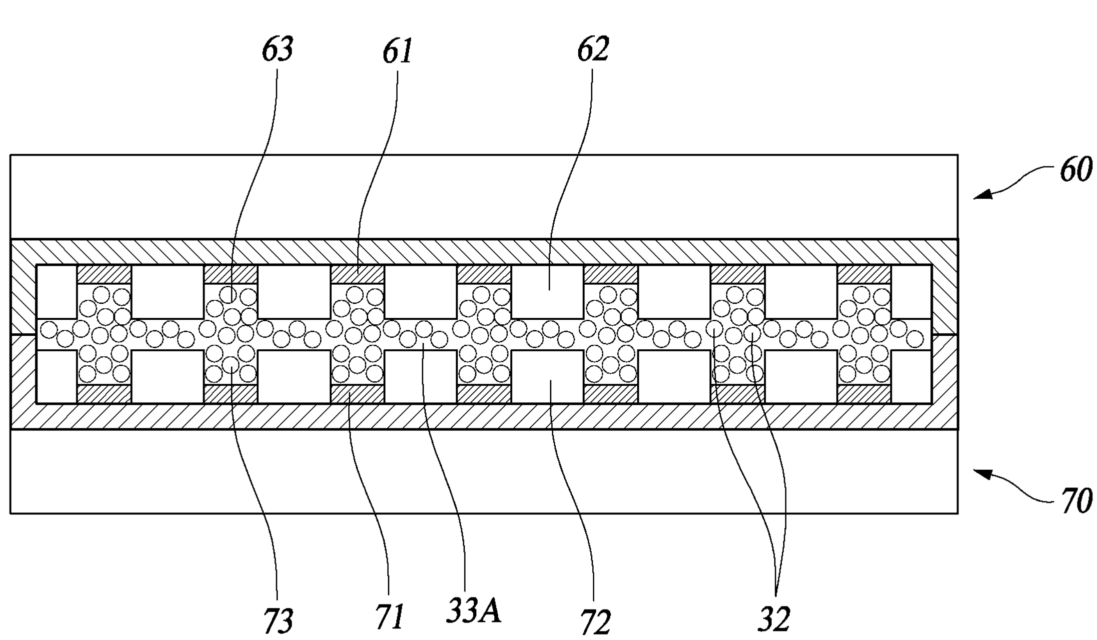
Figure 10:
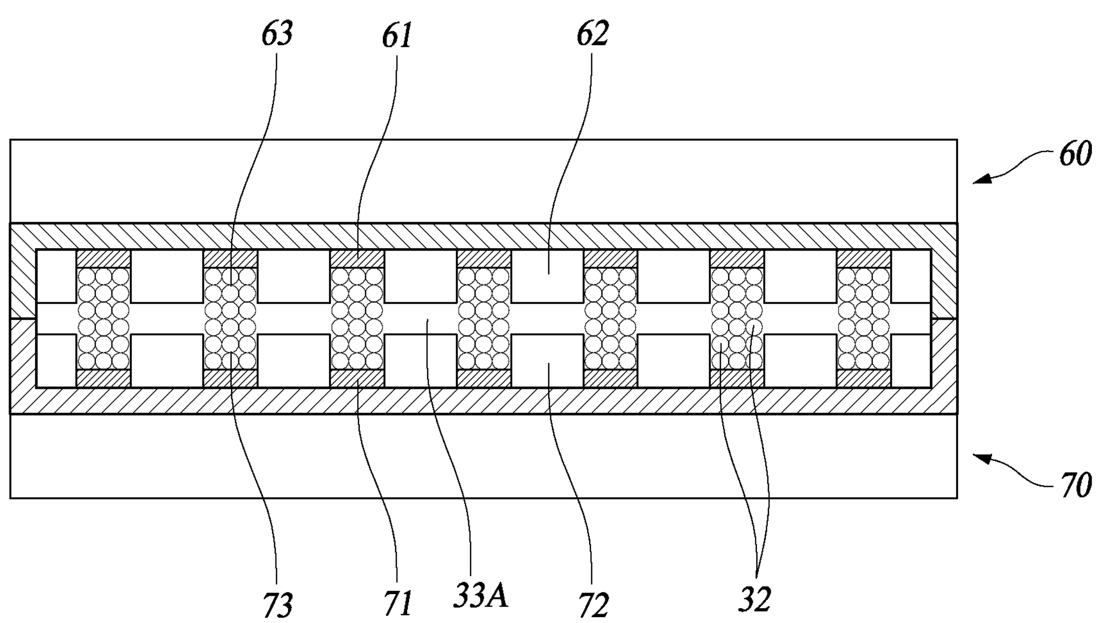
Figure 11:
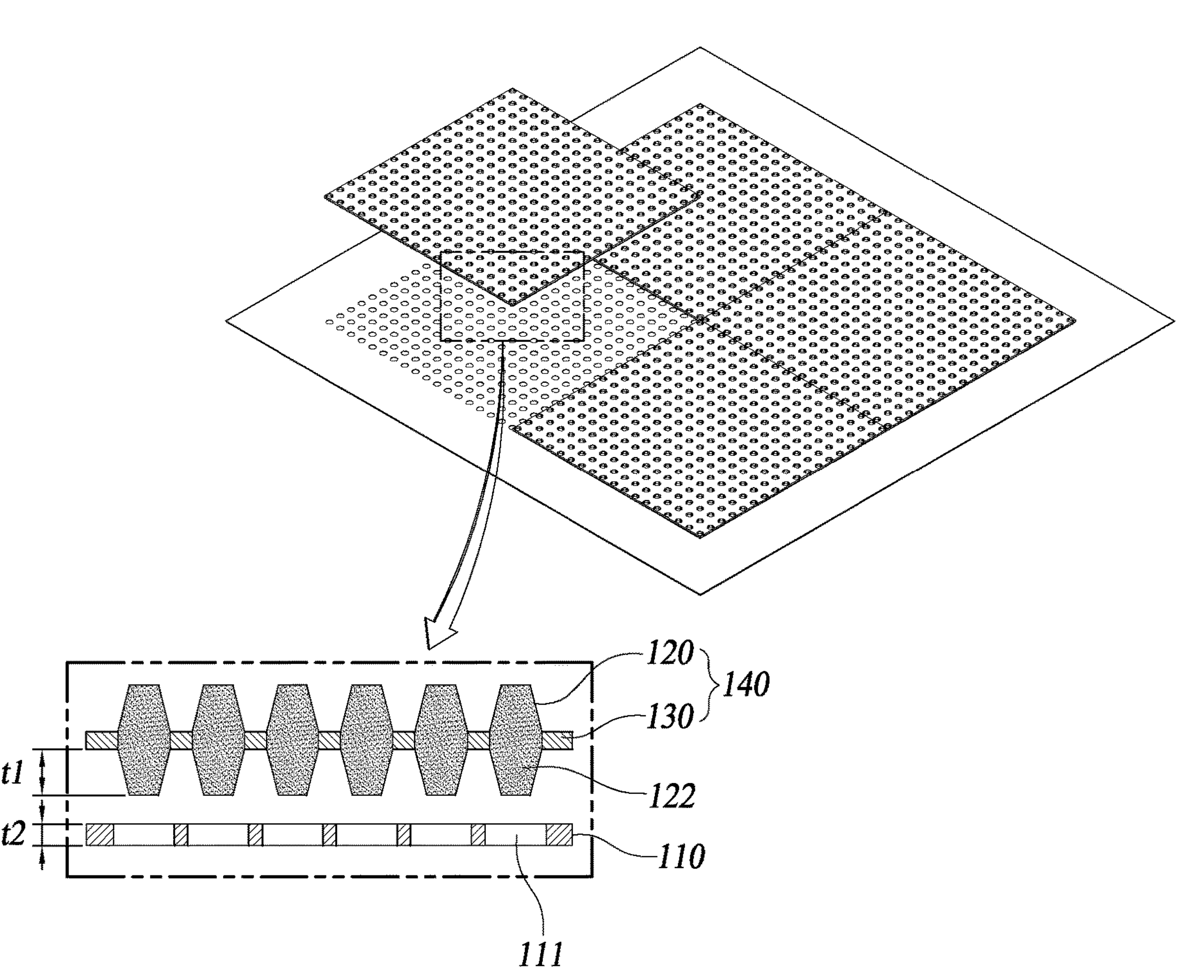
FIGS. 11 and 12 are views showing a state in which the electrically-conductive blocks according to one embodiment of the present disclosure are being coupled to the support member.
Figure 12:
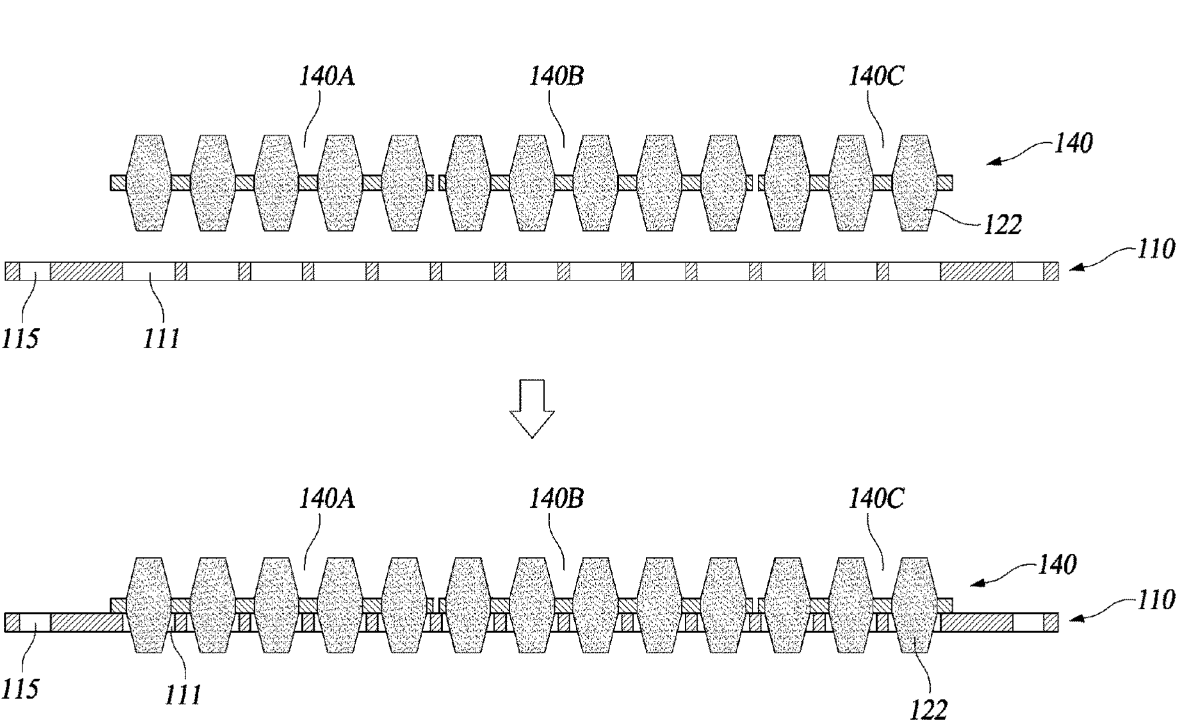

FIG. 5 is a view showing a rubber socket according to one embodiment of the present disclosure, FIG. 6 is a view showing a support member of the rubber socket according to one embodiment of the present disclosure, FIG. 7 is a view showing an electrically-conductive block of the rubber socket according to one embodiment of the present disclosure, FIGS. 8 to 10 are views schematically showing the process of manufacturing the electrically-conductive block of the rubber socket according to one embodiment of the present disclosure, and FIGS. 11 and 12 are views showing a state in which the electrically-conductive blocks according to one embodiment of the present disclosure are being coupled to the support member.

In this specification, when describing each component of a rubber socket, since the rubber socket is disposed between a device under test and a tester, a portion close to the device under test is defined as an upper surface, an upper end or an upper side, and a portion close to the tester is defined as a lower surface, a lower end or a lower side. Additionally, the same symbol is used for indicating the same component and a description thereof is omitted.

As depicted in the drawings, a rubber socket 100 according to one embodiment of the present disclosure is a prefabricated rubber socket disposed between a device 10 under test and a tester 20 to electrically connect terminals 11 of the device under test and pads 21 of the tester to each other, and the above rubber socket 10 includes a plate-shaped support member 110 and a plurality of electrically-conductive blocks 140.

The plate-shaped support member 110 includes a central region portion 112 having through holes 111 formed therein and at positions corresponding to the terminals of the device under test, respectively and having a plurality of divided zones, and a peripheral region portion 113 located outside the central region portion. In addition, each of the electrically-conductive blocks 140 is disposed on each of the plurality of divided zones of the support member 110, and is provided with electrically-conductive parts 120 formed by arranging a plurality of electrically-conductive particles 32 in an elastic insulating material in a thickness direction and an insulating part 130 disposed around the electrically-conductive parts to insulate and support the electrically-conductive parts.

The electrically-conductive parts 120 are formed at positions corresponding to the through holes of the divided zone, respectively, each electrically-conductive part has a lower protruding portion 122 protruding below the insulating part, having a thickness greater than that of the support member and inserted into the through hole, and a lower surface 132 of the insulating part is adhered to an upper surface 116 of the support member by an adhesive applied the above upper surface, so the electrically-conductive block is coupled to the support member.

As shown in FIGS. 5 and 6, the support member 110 is a member provided for supporting the electrically-conductive block 140, and this support member is formed in the form of a plate with a predetermined thickness, and may be made of engineering plastic such as FR4, polyimide film or the like. A shape of the support member is preferably rectangular, but is not limited thereto.

The support member 110 may be divided into the central region portion 112 and the peripheral region portion 113 placed outside the central region portion.

The central region portion 112 is a region corresponding to a region where the terminals of the device under test are arranged, and, in this central region portion, the through hole 111 penetrating the support member from the upper surface 116 to the lower surface 117 thereof in a thickness direction is formed at each position corresponding to each terminal of the device under test. The central region portion 112 may be divided into the multiple zones. The divided zones are zones on which electrically-conductive blocks are placed, respectively, and a size and number thereof may be determined in light of the ease of manufacturing of the electrically-conductive blocks and the reliability of the product.

Although FIG. 6 exemplarily illustrates the four divided zones having the same size, the present disclosure is not limited thereto, and the divided zones may have different sizes and there may be two or more divided zones. Here, it should be noted that the divided zones are not formed by actually dividing central region portion, but are virtual zones divided according to the size of electrically-conductive blocks which were separately manufactured.

The peripheral region portion 113 constitutes an edge of the rubber socket, and a plurality of position alignment holes 115 for aligning a position of the support member with respect to the tester 20 or the device 10 under test may be formed in the peripheral region portion.

As shown in FIGS. 7 and 12, the electrically-conductive blocks 140 are disposed on the plurality of divided zones of the support member 110, respectively, and each electrically-conductive block includes the electrically-conductive parts 120 formed by arranging the plurality of electrically-conductive particles 32 in the elastic insulating material in a thickness direction, and the insulating part 130 disposed around the electrically-conductive parts to insulate and support the electrically-conductive parts.

The electrically-conductive block 140 has the characteristic of anisotropic conductivity by which the electrically-conductive block exhibits conductivity only in a thickness direction thereof, that is, only in a vertical direction thereof, or exhibits conductivity only in the thickness direction thereof and exhibits conductivity only in a surface direction when pressurized in the thickness direction thereof.

The electrically-conductive block 140 has a size corresponding to the divided zone of the support member, and the electrically-conductive blocks 140 having a corresponding size are disposed in each divided zone. Accordingly, when all the electrically-conductive blocks 140 are disposed, the central region portion 112 of the support member is completely filled with the electrically-conductive blocks.

The electrically-conductive part 120 includes the elastic insulating material and the plurality of electrically-conductive particles 32 contained in the elastic insulating material, and the plurality of electrically-conductive particles are arranged in the thickness direction, that is the vertical direction, of the electrically-conductive block. An upper end of the electrically-conductive part 120 may come into contact with the terminal 11 of the device 10 under test 10, and a lower end may come into contact with the pad 21 of the tester 20, and the electrically-conductive part may function as an electrically-conductive path, which electrically connects the terminal of the device under test and the pad of the tester, to transmit an electrical signal between the device 10 under test 10 and a board of the tester 20.

The electrically-conductive part 120 includes the lower protruding portion 122 protruding below from the lower surface 132 of the insulating part 130. The lower protruding portion 122 should have a width and thickness such that it may pass through the through hole 111 of the support member 110 and come into contact with the pad of the tester. Therefore, the electrically-conductive part 120 is configured such that a thickness t1 of the lower protruding portion 122 protruding below from the insulating part 130 is greater than a thickness t2 of the support member 110 and a width of the lower protruding portion 122 is smaller than or equal to that of the through hole 111.

Additionally, the electrically-conductive part 120 may further have an upper protruding portion 121 protruding above the upper surface 131 of the insulating part 130. The electrically-conductive part having the upper protruding portion 121 is useful when the device under test has a land grid array (LGA) terminal since the upper protruding portion may be more easily connected to the flat-shaped LGA terminal.

As the elastic insulating material constituting the electrically-conductive part 120, a heat-resistant polymer material with a cross-linked structure, for example, a silicon rubber, a soft liquid epoxy rubber, etc. may be employed.

In addition, as the electrically-conductive particles constituting the electrically-conductive part 120, the particles which have magnetism so that they can be reacted with a magnetic field may be employed. For example, as the electrically-conductive particles, particles of metal exhibiting magnetism, such as iron, nickel, cobalt, etc., or alloy particles of the above metals, or particles containing the above metals, or an element in which the above metal particles act as core particle and surfaces of the core particles are plated with metal having good conductivity, such as aurum, silver, palladium, radium or the like, may be employed.

The insulating part 130 surrounds the plurality of electrically-conductive parts 120 to support the plurality of electrically-conductive parts 120 to be spaced apart from each other, and insulates the adjacent electrically-conductive parts 120 from each other. The insulating part 130 may be formed from an elastic insulating material, and the elastic insulating material may be the same as the elastic insulating material of the electrically-conductive part 120. Furthermore, the insulating part 130 may also be formed using engineering plastic such as a polyimide film or the like, or an inelastic material, which does not cause positional deformation, such as PCB. The insulating part formed from such inelastic material is not shrunk or expanded, so this can be more easily coupled to the support member.

FIGS. 8 to 10 schematically show a process of manufacturing one electrically-conductive block, taking as an example that the insulating part of the rubber socket according to one embodiment of the present disclosure is made of an elastic insulating material.

As shown in FIG. 8, an upper magnetism mould 60 having upper ferromagnetic bodies 61 formed on portions where the electrically-conductive parts are to be formed and upper non-magnetic bodies 62 formed on other portions; and a lower magnetism mould 70 disposed to face the upper magnetism mould, and having lower ferromagnetic bodies 71 formed on portions where the electrically-conductive parts are to be formed and lower non-magnetic bodies 72 formed on other portions are prepared. A cavity 80, which is a space in which the electrically-conductive block 140 will be formed, is provided between the upper magnetism mould 60 and the lower magnetism mould 70.

A thickness of the upper ferromagnetic body 61 is smaller than that of the upper non-magnetic body 62. Therefore, an upper groove 63 is provided among the upper non-magnetic bodies 62 in a shape corresponding to the upper ferromagnetic body 61. As such, by providing the upper groove 63 among the upper non-magnetic bodies 62, the upper protruding portions 121 protruding above the insulating part 130 may be formed on the electrically-conductive parts 120, respectively, of the rubber socket 100 to be manufactured. Similarly, a thickness of the lower ferromagnetic body 71 is smaller than that of the lower non-magnetic body 72. Accordingly, a lower groove 73 is provided among the adjacent lower non-magnetic bodies 72 in a shape corresponding to the lower ferromagnetic body 71. As such, by providing the lower groove 73 among the lower non-magnetic bodies 72, the lower protruding portions 122 protruding below the insulating part 130 may be formed on the electrically-conductive parts 120, respectively, of the rubber socket 100 to be manufactured.

Next, as shown in FIGS. 9 and 10, an electrically-conductive particle mixture in which the plurality of electrically-conductive particles 32 are dispersed in a liquefied elastic insulating material 33A is injected into the cavity 80. After the cavity 80 is filled with the electrically-conductive particle mixture, a magnetic field is applied to the electrically-conductive particle mixture. For example, by placing electromagnets on an upper surface of the upper magnetism mould 60 and a lower surface of the lower magnetism mould 70 and operating them, a vertical magnetic field can be applied to the electrically-conductive particle mixture, with which the cavity 80 is filled, in the vertical direction.

When the vertical magnetic field is applied, the electrically-conductive particles dispersed in the liquefied elastic insulating material are oriented such that they are concentrated between the upper ferromagnetic body 61 and the lower ferromagnetic body 71 and simultaneously lined up in the thickness direction. In this state, after the electrically-conductive particle mixture is cured, when the upper and lower magnetism moulds are separated from each other, the electrically-conductive block 140 including the electrically-conductive parts 120, in which the plurality of electrically-conductive particles are arranged in the elastic insulating material, and the insulating part 130 made of the elastic insulating material can be completed.

Although the electrically-conductive part of the electrically-conductive block manufactured by the above-described method has a cylindrical shape, when the upper groove 63 and the lower groove 73 are processed with a laser, etc., the upper and lower grooves are processed into a slight truncated cone shape due to characteristics of the laser. Therefore, in the present disclosure, when depicting a cross-sectional view of the electrically-conductive part, the upper protruding portion and the lower protruding portion are depicted as having a truncated cone shape in a cross-section. In addition, although in the electrically-conductive part, the electrically-conductive particles are arranged in the thickness direction of the electrically-conductive part, for convenience, the electrically-conductive parts are simply shown as indicated by the reference numeral 120 in FIG. 11.

Similarly, when the insulating part 120 is formed using engineering plastic such as a polyimide film or an inelastic material such as PCB, the electrically-conductive block having the insulating part made of an inelastic material may be formed by forming the through hole (not shown) at locations of the insulating part where the electrically-conductive parts is to be formed, filling the through holes, the upper groove 63 and the lower groove 73 with the electrically-conductive particle mixture, applying a magnetic field, and then performing a curing process.

FIGS. 11 and 12 are views showing a state in which the electrically-conductive blocks according to one embodiment of the present disclosure are being coupled to the support member. As shown in FIG. 11, the rubber socket 100 is constructed by arranging and assembling the electrically-conductive blocks 140 on the plurality of divided zones of the support member 110, respectively. A cross-sectional view in FIG. 11 shows a state before the electrically-conductive block and the support member are assembled.

FIG. 12 exemplarily shows that the rubber socket 100 is configured by assembling three electrically-conductive blocks 140A, 140B and 140C, which are independently divided, on the divided zones of the support member 110, respectively. The electrically-conductive block 140A and the electrically-conductive block 140B have the same size, and the electrically-conductive block 140C has a size different from that of the electrically-conductive block 140A and the electrically-conductive block 140B. That is, the electrically-conductive block may be formed to have various shapes and sizes according to a shape of the rubber socket 100. It may be checked in advance whether the electrically-conductive blocks 140A, 140B and 140C have defects before being assembled into the support member 110, so it is possible to use the electrically-conductive blocks which do not have any defect.

The electrically-conductive blocks 140 may be assembled to the support member 110 as follows.

An adhesive (not shown) is applied to upper surfaces of the plurality of divided zones of the support member 110. Silicon adhesive or glue by which silicon may be adhered, or the like may be employed as the adhesive. The electrically-conductive block 140A is placed above the corresponding divided zone of the support member 110, the lower protruding portion 122 of the electrically-conductive part 120 protruding from the electrically-conductive block 140A is inserted into the through hole 111 of the support member 110, and the lower surface 132 of the insulating portion 130 comes into close contact with the upper surface 116 of the support member 110.

Thereafter, when a curing process is performed, the adhesive is cured, so the electrically-conductive block 140A may be firmly attached to one divided zone of the support member. By attaching the electrically-conductive blocks 140B and 140C to the corresponding divided zones of the support member, respectively, in the same manner, the prefabricated rubber socket may be completed.

Figure 13:
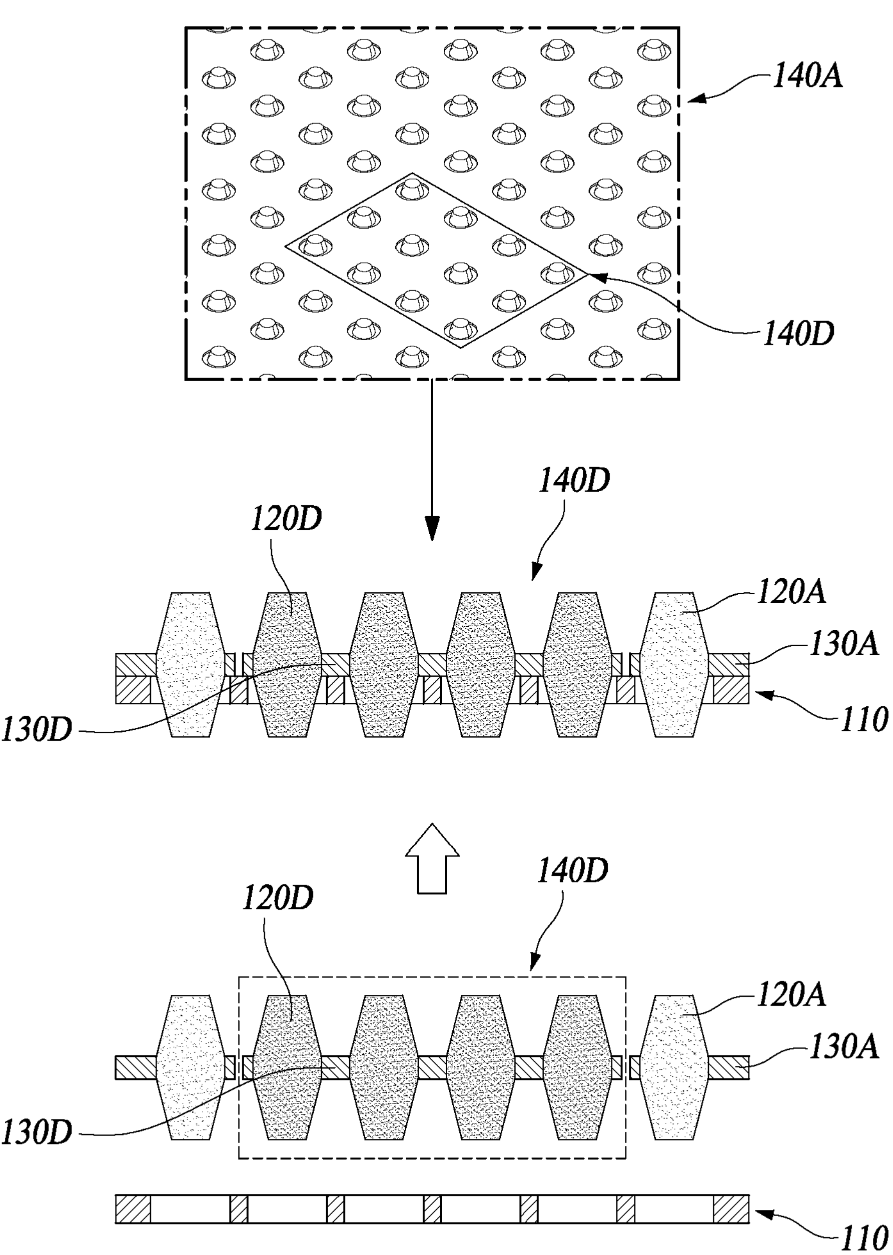
FIG. 13 is a view showing a state in which a piece of the electrically-conductive block, which is required to repair, in the rubber socket according to one embodiment of the present disclosure is being replaced with a piece of the electrically-conductive block or repair.

FIG. 13 exemplarily shows that a piece of the electrically-conductive block 140A, including a damaged electrically-conductive part, of the rubber socket according to one embodiment of the present disclosure is replaced with new piece of the electrically-conductive block for repair.

As shown in the drawing, when the damaged electrically-conductive part is found in a piece of the electrically-conductive block 140A, the piece, including the damaged electrically-conductive part, of the electrically-conductive block 140A is cut with a laser, etc. and then removed, and new piece 140D of the electrically-conductive block, which includes a normal electrically-conductive part and is separately manufactured to have a size corresponding to that of the removed piece of the electrically-conductive block, is inserted into an area from which the piece was removed, the electrically-conductive block 140A including the new piece 140D of the electrically-conductive block is attached to the support member 100 to obtain the repaired rubber socket. In this case, the insulating part 130A of the electrically-conductive block 140A and an insulating part 130D of the new piece 140 of the electrically-conductive block are isolated from each other.

Although if any one electrically-conductive part is damaged, it is possible to replace only the piece, including the damaged electrically-conductive part, of the electrically-conductive block with a new piece of the electrically-conductive block for repair, it is more preferable to replace a piece of the electrically-conductive block, including the damaged electrically-conductive part as well as another electrically-conductive parts surrounding it, with new piece, which includes normal electrically-conductive parts, of the electrically-conductive block for repair in terms of ease of cutting and assembly.

Therefore, in the prefabricated rubber socket according to one embodiment of the present disclosure, the electrically-conductive block is checked in advance whether it has defects, the damaged electrically-conductive block is replaced with a non-defective electrically-conductive block, and the non-defective electrically-conductive block is assembled to the support member, so the faulty rubber socket nearly does not occur.

In addition, in the prefabricated rubber socket according to one embodiment of the present disclosure, instead of replacing the entire electrically-conductive block including the damaged electrically-conductive part, only a piece of the electrically-conductive block, which includes the damaged electrically-conductive part, can be replaced with new piece of the electrically-conductive block, which includes a normal electrically-conductive part, for repair, so this electrically-conductive block may be reused and it is possible to significantly reduce manufacturing cost for the rubber socket.

Furthermore, in the prefabricated rubber socket according to one embodiment of the present disclosure, since the electrically-conductive block having the small-sized electrically-conductive blocks, each of which including the electrically-conductive parts with uniform electrical characteristics, can be separately manufactured and assembled, cost for manufacturing the magnetism mould is reduced, and stable test can be performed by transmitting uniform electrical signals to a large-sized semiconductor device.

Also, in the prefabricated rubber socket according to one embodiment of the present disclosure, the electrically-conductive blocks are independently separated from each other and can be thus operated individually without being influenced by other electrically-conductive blocks, so it is possible to prevent deformation of the electrically-conductive block caused by a transfer of necessary deformation of the adjacent the electrically-conductive block.

In addition, in the prefabricated rubber socket according to one embodiment of the present disclosure, since the position alignment holes are provided in the support member for aligning the position of the support member with respect to the tester or the device under test, a process for attaching the separate frame is not required, thereby improving manufacturing efficiency.

Figure 14:
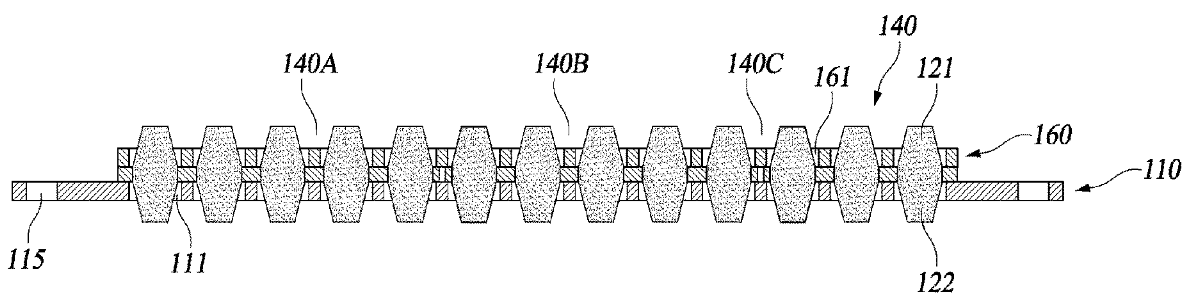
FIG. 14 is a view showing a state in which a support film is attached to the rubber socket according to one embodiment of the present disclosure.

FIG. 14 is a view shows a state in which a support film is attached to the rubber socket according to one embodiment of the present disclosure. As shown in the above drawing, in the rubber socket 100 according to one embodiment of the embodiment, it is possible to more firmly fix the shape and position of the rubber socket by attaching a support film 160 to an upper side of the electrically-conductive block 140.

The support film 160 is a sheet member which has a shape corresponding to the central region portion 112 of the support member 110, and this support film has film holes 161 formed therein at positions corresponding to the electrically-conductive parts 120, respectively, and may be made of material such as a polyimide film or the like. The support film 160 may be adhered to the upper surface 131 of the insulating portion 130 of each electrically-conductive block 140 using a silicon adhesive or the like. The rubber socket to which the support film 160 is attached is preferably applied to the electrically-conductive block in which the electrically-conductive part 120 has the upper protruding portion 121. This is because that if the electrically-conductive part protrudes above the support film, electrical connection between the electrically-conductive part and the terminal of the device under test can be made more stably.

Figure 15:
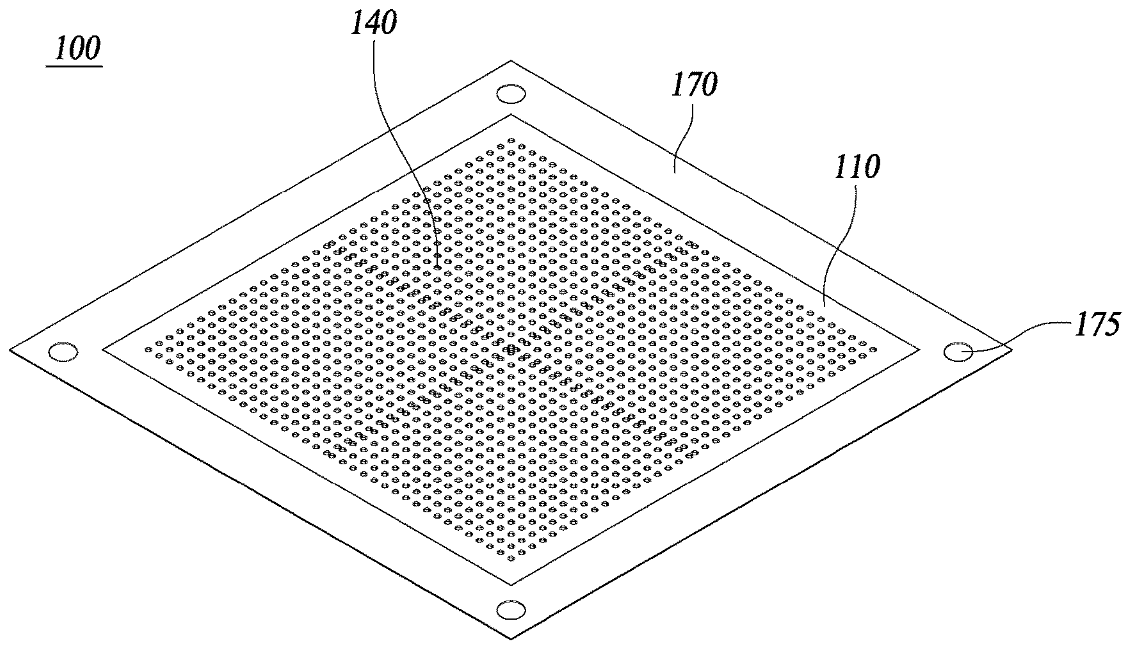
FIG. 15 is a view showing a state in which a frame is attached to the rubber socket according to one embodiment of the present disclosure.

FIG. 15 is a view showing a state in which a frame is attached to the rubber socket according to one embodiment of the present disclosure. As shown in the drawing, an edge of the peripheral region portion 113 of the support member 110 may be attached to a frame 170 to allow the support member to be supported by the frame. In this case, a plurality of position alignment holes 175 for position alignment may be formed in an edge of the frame 170.

Although the present disclosure has been described above with reference to the preferred examples, the spirit and scope of the present disclosure is not limited to the form described and shown above. For example, although the drawing shows that the electrically-conductive parts of the electrically-conductive blocks all have the same height, it is also possible to manufacture the rubber socket in which the electrically-conductive blocks having the electrically-conductive parts with different height are assembled. In the device under test on which a large warpage is occurred, by arranging the electrically-conductive blocks having the electrically-conductive parts with different heights depending on the amount of warpage, contact characteristics between each electrically-conductive part and the corresponding terminal of the device under test can be improved.

Although the present disclosure has been shown and described in connection with preferred embodiments for illustrating the principles of the present disclosure, the present disclosure is not limited to the construction and operation as shown and described. Rather, it will be apparent to those skilled in the art that many changes and modifications can be made to the present disclosure without departing from the spirit and scope of the appended claims.

What is claimed is:

1. A rubber socket disposed between a device under test and a tester to electrically connect terminals of the device under test and pads of the tester to each other, comprising:

a plate-shaped support member comprising a central region portion having through holes formed therein and at positions corresponding to the terminals of the device under test, respectively and having a plurality of divided zones, and a peripheral region portion located outside the central region portion; and a plurality of electrically-conductive blocks, each block disposed in one of the divided zones of the support member and each block having a size corresponding to a size of one of the divided zones, respectively, the electrically-conductive blocks being individually manufactured prior to being disposed on the support member and independently separated from each other such that insulating parts of adjacent electrically-conductive blocks are not connected to each other, each electrically-conductive block being provided with electrically-conductive parts formed by arranging a plurality of electrically-conductive particles in an elastic insulating material in a thickness direction and an insulating part disposed around the electrically-conductive parts to insulate and support the electrically-conductive parts, wherein the electrically-conductive parts are formed at positions corresponding to the through holes of the divided zones, respectively, each electrically-conductive part has a lower protruding portion protruding below the insulating part, having a thickness greater than that of the support member and inserted into the through hole, and a lower surface of the insulating part is adhered to an upper surface of the support member by an adhesive applied the upper surface of the support member, so the electrically-conductive block is coupled to the support member.

2. The prefabricated rubber socket of claim 1, wherein the plurality of divided zones has the same size.

3. The prefabricated rubber socket of claim 1, wherein the electrically-conductive part has an upper protruding portion protruding above the insulating part.

4. The prefabricated rubber socket of claim 3, wherein a support film is attached to an upper surface of the insulating part.

5. The prefabricated rubber socket of claim 1, wherein the adhesive is silicon adhesive.

6. The prefabricated rubber socket of claim 1, wherein the support member is made of engineering plastic.

7. The prefabricated rubber socket of claim 1, wherein the support member has a plurality of position alignment holes formed in the peripheral region portion thereof for aligning a position thereof.

8. The prefabricated rubber socket of claim 1, further comprising a frame to which the peripheral region portion of the support member is attached, the frame comprising a plurality of position alignment holes formed therein for aligning a position thereof.

9. The prefabricated rubber socket of claim 1, wherein the plurality of electrically-conductive blocks comprises blocks each having electrically-conductive parts of the same height, wherein at least one of the blocks of the socket has electrically-conductive parts of a height different from that of another block of the socket.

* * * * *